(12) United States Patent
Peng et al.

(10) Patent No.: US 7,744,177 B2
(45) Date of Patent: Jun. 29, 2010

(54) MOUNTING APPARATUS FOR SLIDE RAIL

(75) Inventors: Wen-Tang Peng, Taipei Hsien (TW); Mo-Ming Yu, Shenzhen (CN); Ke Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 148 days.

(21) Appl. No.: 12/056,239

(22) Filed: Mar. 26, 2008

(65) Prior Publication Data

US 2009/0160300 A1 Jun. 25, 2009

(30) Foreign Application Priority Data

Dec. 20, 2007 (CN) .................. 2007 1 0203288

(51) Int. Cl.
*A47B 88/00* (2006.01)
(52) U.S. Cl. .................. 312/334.4; 312/223.1
(58) Field of Classification Search .............. 312/334.4, 312/334.5, 265.1–265.4, 223.1, 319.1; 211/26; 248/220.21, 220.22, 222.14, 223.41, 225.11
See application file for complete search history.

(56) References Cited

U.S. PATENT DOCUMENTS

| | | | | |
|---|---|---|---|---|
| 6,749,275 B2 * | 6/2004 | Cutler et al. | ............. | 312/334.4 |
| 6,773,080 B2 * | 8/2004 | Chen et al. | ............... | 312/265.1 |
| 6,830,300 B2 * | 12/2004 | Lauchner | .................. | 312/334.5 |
| 6,871,920 B2 * | 3/2005 | Greenwald et al. | ........ | 312/334.4 |
| 6,926,378 B2 * | 8/2005 | Greenwald et al. | ........ | 312/334.4 |
| 6,929,339 B1 * | 8/2005 | Greenwald et al. | ........ | 312/334.4 |
| 6,948,691 B2 * | 9/2005 | Brock et al. | ............ | 248/222.13 |
| 6,957,878 B2 * | 10/2005 | Greenwald et al. | ........ | 312/334.4 |
| 7,281,633 B2 * | 10/2007 | Hartman et al. | ................ | 211/26 |
| 7,281,694 B2 * | 10/2007 | Allen et al. | ................... | 248/244 |
| 7,284,672 B2 * | 10/2007 | Tsai | ............................ | 211/208 |
| 7,357,362 B2 * | 4/2008 | Yang et al. | ............. | 248/221.11 |
| 7,552,899 B2 * | 6/2009 | Chen et al. | ................ | 248/224.8 |
| 2004/0189162 A1 * | 9/2004 | Davis et al. | .............. | 312/265.3 |
| 2005/0206285 A1 * | 9/2005 | Greenwald et al. | ........ | 312/334.5 |
| 2005/0274680 A1 * | 12/2005 | Allen et al. | .................... | 211/26 |
| 2005/0285493 A1 * | 12/2005 | Hu et al. | ................... | 312/334.4 |
| 2008/0078899 A1 * | 4/2008 | Chen et al. | ............. | 248/220.21 |
| 2008/0230496 A1 * | 9/2008 | Henderson et al. | ............ | 211/26 |

* cited by examiner

*Primary Examiner*—Janet M Wilkens
*Assistant Examiner*—Dan Rohrhoff
(74) *Attorney, Agent, or Firm*—Frank R. Niranjan

(57) ABSTRACT

A mounting apparatus is configured for mounting a slide rail to a bracket. The bracket includes a flange with a plurality of mounting holes defined therein. A plurality of mounting rods is arranged on the slide rail for engaging in the corresponding mounting holes of the flange. The mounting apparatus includes a resisting member fixed to the slide rail, and an operating member pivotably attached to the resisting member. The resisting member includes a resisting portion configured for engaging with the flange. The operating member is capable of urging the resisting portion of the resisting member away from the flange.

12 Claims, 6 Drawing Sheets

MOUNTING APPARATUS FOR SLIDE RAIL

BACKGROUND

1. Field of the Invention

The present invention relates to mounting apparatuses, and more particularly to a mounting apparatus for mounting a slide rail.

2. Description of Related Art

Traditionally, a slide rail is used between two objects that can move relative to each other, such as between a desk and a drawer, a server, a rack etc.

A conventional slide rail assembly for a drawer and a desk includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a distance out from the desk. A plurality of screws is used for mounting the outer slide rail to a bracket of the desk. Therefore, installing/uninstalling the outer slide rail to/from the bracket is inconvenient and time-consuming.

Consequently, it is desired to provide a mounting apparatus for conveniently mounting a slide rail to a bracket.

SUMMARY

In one embodiment, a mounting apparatus is configured for mounting a slide rail to a bracket. The bracket includes a flange with a plurality of mounting holes defined therein. A plurality of mounting rods is arranged on the slide rail for engaging in the corresponding mounting holes of the flange. The mounting apparatus includes a resisting member fixed to the slide rail, and an operating member pivotably attached to the resisting member. The resisting member includes a resisting portion configured for engaging with the flange. The operating member is capable of urging the resisting portion of the resisting member away from the flange.

Other advantages and novel features of the present invention will become more apparent from the following detailed description of embodiment when taken in conjunction with the accompanying drawings, in which:

DETAILED DESCRIPTION

Figure 1:
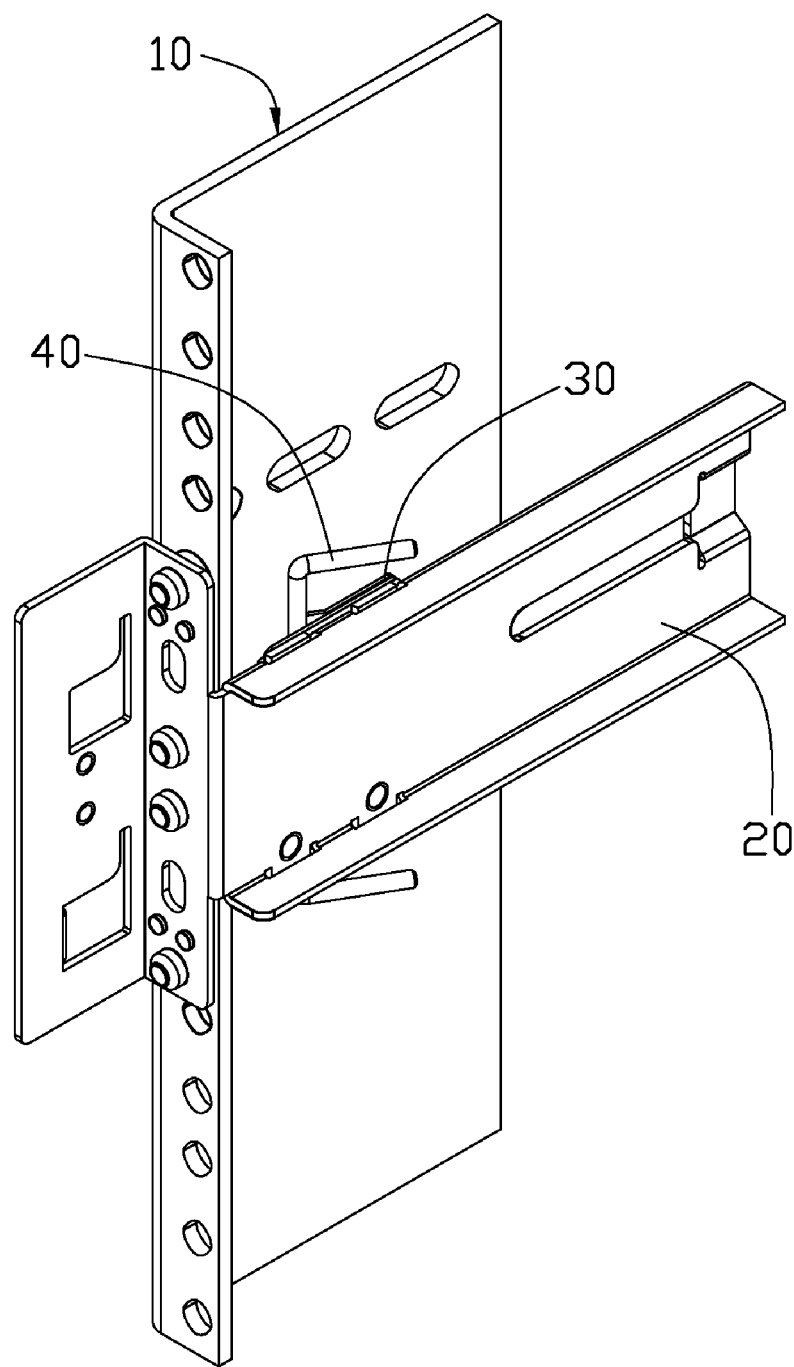
FIG. 1 is an assembled, isometric view of a mounting apparatus for a slide rail according to an embodiment of the present invention, showing the slide rail being mounted to a bracket via the mounting apparatus.

Referring to FIG. 1, in an embodiment of the present invention, a mounting apparatus is provided for mounting a slide rail 20 to a bracket 10. The mounting apparatus includes a resilient resisting member 30 and an operating member 40.

Figure 2:
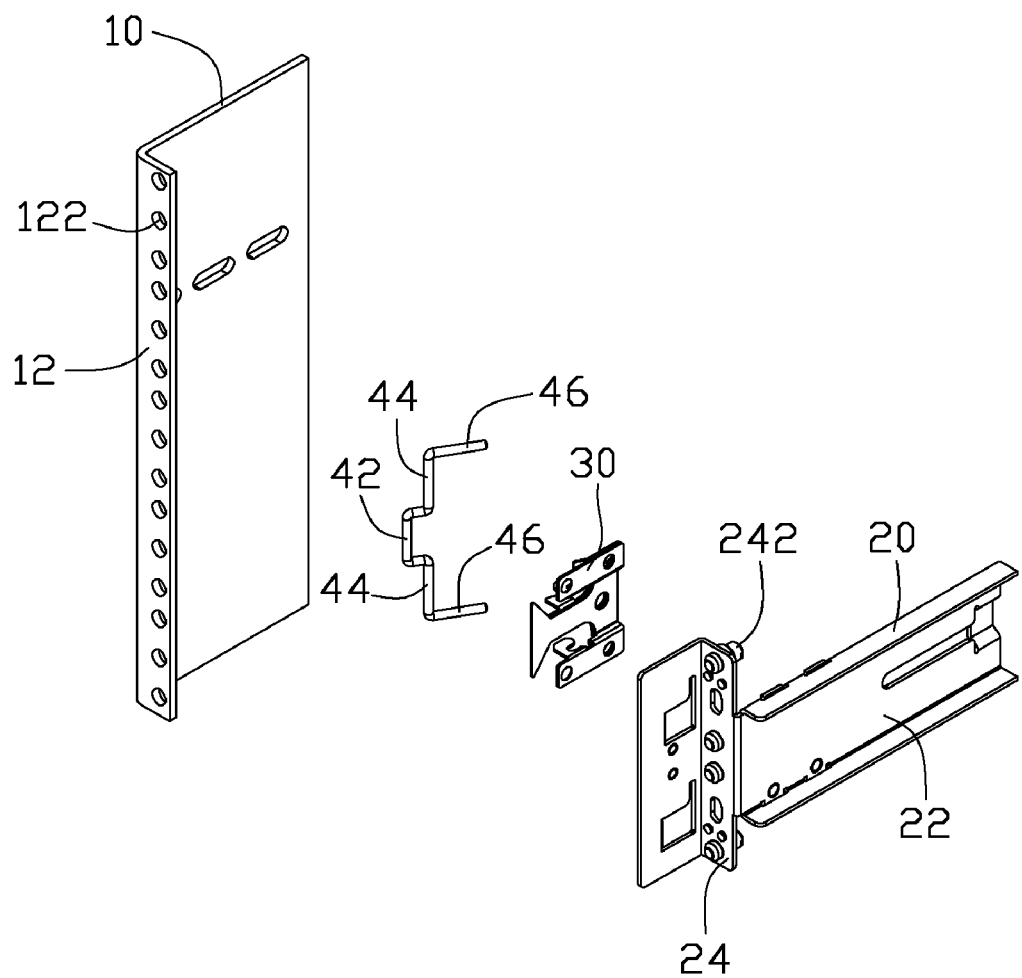
FIG. 2 is an exploded, isometric view of FIG. 1, the mounting apparatus including a resisting member and an operating member.
Figure 3:
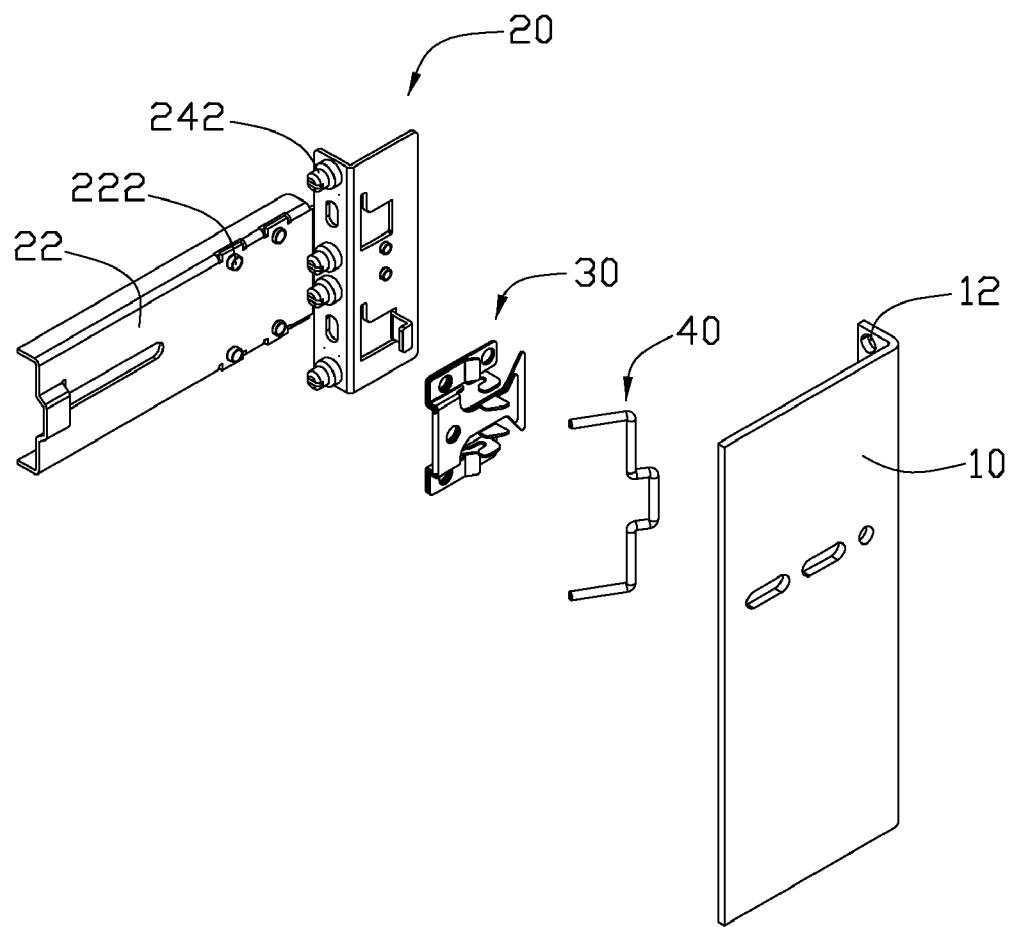
FIG. 3 is similar to FIG. 2, but viewed from another aspect.

Referring also to FIGS. 2 and 3, the bracket 10 includes a flange 12 bent from one side thereof. A plurality of through holes 122 is defined in the flange 12 from top to bottom.

The slide rail 20 includes a base wall 22 and two sidewalls extending from opposite sides of the base wall 22 respectively. A mounting plate 24 perpendicularly extends from one end of the base wall 22, opposite to the sidewalls. A plurality of mounting rods 242 is arranged on the mounting plate 24 from top to bottom, parallel to and at a side of a surface opposite to the sidewalls, of the base wall 22. A plurality of mounting posts 222 protrudes from the surface opposite to the sidewalls of the base wall 22 of the slide rail 20 in the vicinity of the mounting plate 24. In this embodiment, the mounting rods 242 are heads of screws screwed into the mounting plate 24.

Figure 4:
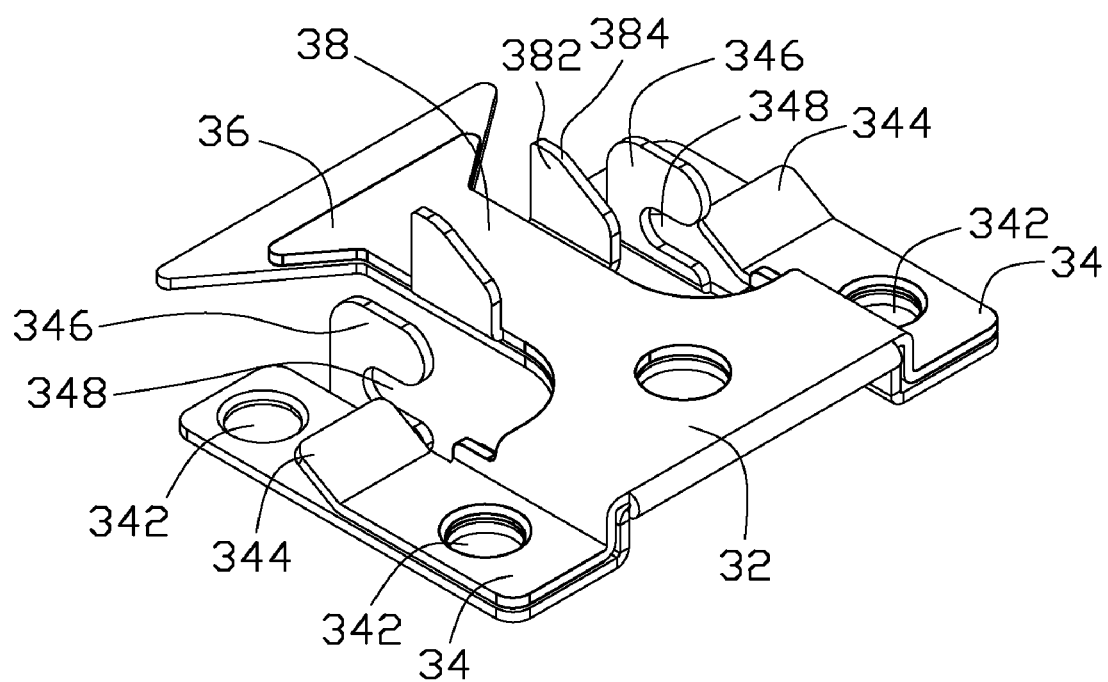
FIG. 4 is an enlarged view of the resisting member of FIG. 2, but viewed from another aspect.

Referring also to FIG. 4, the resisting member 30 is made by bending a resilient metal plate. The resisting member 30 includes a main body 32, two wings 34 extending down and outward from opposite ends of the main body 32 respectively, a taper-shaped resisting portion 36, and a connecting portion 38 extending from one side of the main body 32 for connecting the resisting portion 36 with the main body 32. Two through holes 342 are defined in each wing 34. A resilient locking tab 344 slantingly extends up from each wing 34 between the through holes 342. A locking plate 346 extends up from one side of each wing 34 adjacent to the connecting portion 38. A locking cutout 348 is defined in the locking plate 346 toward the main body 32. Two protrusions 382 extend up from opposite sides of the connecting portion 38. An inclined surface 384 is formed on a top of each protrusion 382.

The operating member 40 is made of a resilient metal wire or similar material. The operating member 40 includes a driving portion 42 at a middle portion thereof, two bent portions perpendicularly extending from opposite ends of the driving portion 42 respectively, two pivoting portions 44 parallel to the driving portion 42 extending outward from distal ends of the bent portions respectively, and two operating portions 46 parallel and opposite to the bent portions perpendicularly extending from distal ends of the pivoting portions 44 respectively.

Figure 5:
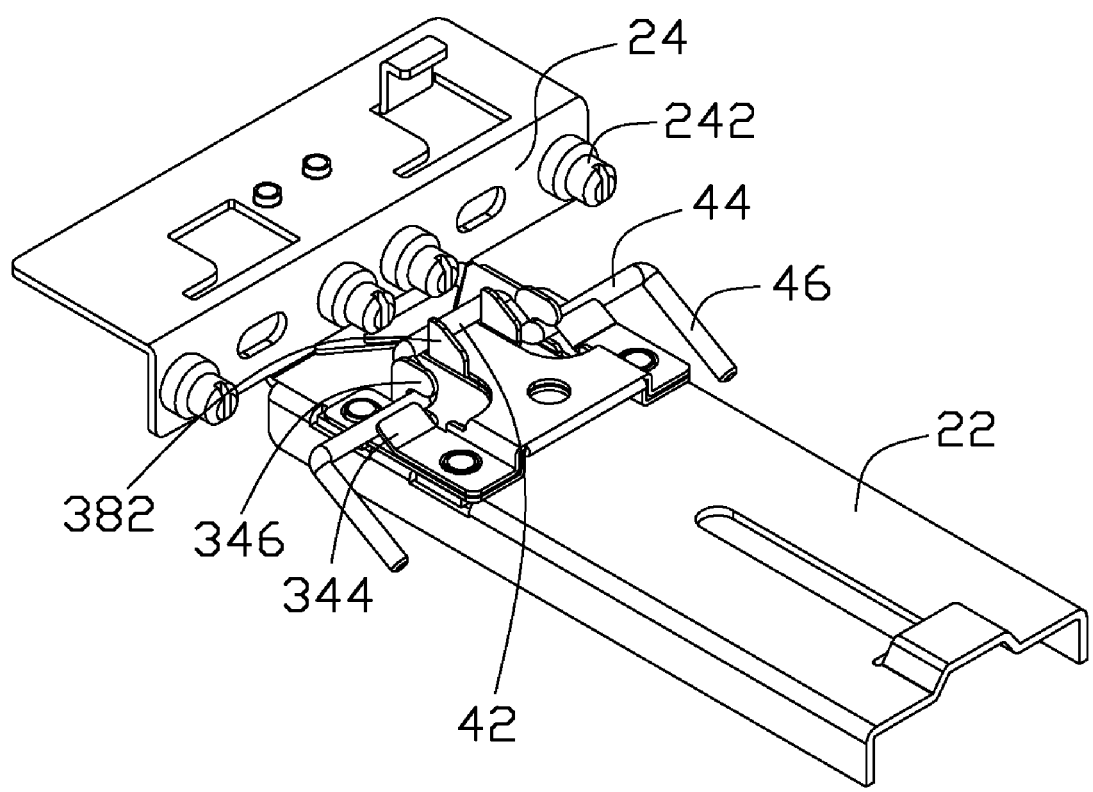
FIG. 5 is an assembled view of the mounting apparatus and the slide rail of FIG. 3, but viewed from another aspect.

Referring also to FIG. 5, in assembly, the resisting member 30 is fixed to the surface opposite to the sidewalls of the slide rail 20 via the mounting posts 222 of the base wall 22 of the slide rail 20 extending through the corresponding through holes 342 of the resisting member 30 to be riveted thereinto. The resisting portion 36 of the resisting member 30 is located between the mounting rods 242 and the base wall of the slide rail 20, and firmly pressed against the mounting rods 242 fixed to the mounting plate 24. The pivoting portions 44 of the operating member 40 ride over the locking tabs 344 of the resisting member 30 to engage in the locking cutouts 348 of the resisting member 30 respectively. The driving portion 42 of the operating member 40 rides over the inclined surfaces 384 of protrusions 382 of the resisting member 30 to tightly contact with the connecting portion 38.

Figure 6:
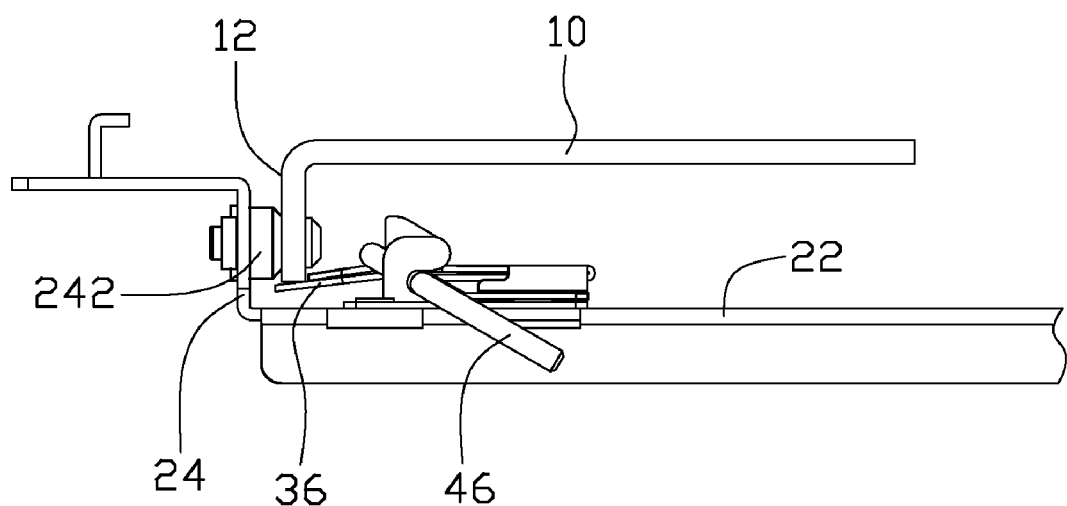
FIG. 6 is a top elevational view of FIG. 1.

Referring also to FIG. 6, in mounting the slide rail 20 to the bracket 10, the operating portions 46 of the operating member 40 are driven to make the operating member 40 rotate around the pivoting portions 44 with the driving portion 42 of the operating member 40 pressing the connecting portion 38 against the resisting portion 36 of the resisting member 30. The mounting rods 242 fixed to the mounting plate 24 extend through the corresponding through holes 122 of the flange 12 of the bracket 10. The operating portions 46 of the operating member 40 is released, the resisting portion 36 of the resisting member 30 rebounds to engage with an edge of the flange 12 of the bracket 10 to drive the mounting rods 242 of the mounting plate 24 to firmly resist against sides adjacent the edge, of the through holes 122 of the bracket 10. Therefore the mounting rods 242 are not easy to escape from the corresponding through holes 122 of the flange 12.

In releasing the slide rail 20 from the bracket 10, the operating portions 46 are driven to make the operating member 40 rotate around the pivoting portions 44. The driving portion 42 of the operating member 40 presses the connecting portion 38 of the resisting member 30 to urge the resisting portion 36 of the resisting member 30 away from the flange 12. Therefore the mounting rods 242 can easily escape from the corresponding through holes 122 of the flange 12.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a slide rail to a bracket, the bracket comprises a flange with a plurality of mounting holes defined therein, a plurality of mounting rods is arranged on the slide rail for engaging in the corresponding mounting holes of the flange, the mounting apparatus comprising:
    a resisting member fixed to the slide rail, the resisting member comprising a main body, two wing portions extending from opposite ends of the main body respectively, and a resilient resisting portion extending from one side of the main body and configured for engaging with the flange, wherein from a middle portion of each of the wing portions a locking tab extends slantingly away from the slide rail, and from one side of each of the wing portions a locking plate extending perpendicularly away from the slide rail, a locking cutout is defined in the locking plate open toward the locking tab; and
    an operating member pivotably attached to the resisting member, the operating member being capable of urging the resisting portion of the resisting member away from the flange;
    wherein the operating member comprises a driving portion formed at a middle portion thereof, two bent portions perpendicularly extending from opposite ends of the driving portion respectively, two pivoting portions extending outward from the bent portions respectively, and two operating portions extending from the pivoting portions respectively, the pivoting portions of the operating member resist against and ride over the locking tabs of the resisting member along an outer surface of the locking tabs to engage in the locking cutouts of the resisting member respectively, then the locking tabs restore to lock the pivoting portions in the locking cutouts of the resisting member, the operating portion is capable of being driven to rotate the operating member around the pivoting portions.

2. The mounting apparatus as described in claim 1, wherein at least one through hole is defined in each of the wing portions, a plurality of mounting posts protrudes from the slide rail for engaging with the resisting member.

3. The mounting apparatus as described in claim 2, wherein the resisting member comprises a connecting portion for connecting the resisting portion to the main body, the driving portion is configured for resisting against the connecting portion of the resisting member.

4. The mounting apparatus as described in claim 3, wherein the connecting portion comprises a protrusion extending up therefrom, for blocking the driving portion of the operating member.

5. The mounting apparatus as described in claim 4, wherein an inclined surface is formed on a top of the protrusion for enabling the driving portion of the operating member to easily ride over the protrusion to tightly contact with the connecting portion.

6. An assembly comprising:
    a bracket comprising a flange with a plurality of mounting holes defined therein;
    a slide rail comprising a mounting plate at one end thereof, a plurality of mounting rods arranged on the mounting plate for engaging in the corresponding mounting holes of the flange;
    a resisting member fixed to the slide rail, the resisting member comprising a main body, two wing portions extending from opposite ends of the main body respectively, and a resilient resisting portion extending from one side of the main body and configured for engaging with the flange, wherein from a middle portion of each of the wing portions a locking tab extends slantingly away from the slide rail, and from one side of each of the wing portions a locking plate extending perpendicularly away from the slide rail, a locking cutout is defined in the locking plate open toward the locking tab; and
    an operating member pivotably attached to the resisting member, the operating member being capable of urging the resisting portion of the resisting member away from the flange;
    wherein the operating member comprises a driving portion formed at a middle portion thereof, two bent portions perpendicularly extending from opposite ends of the driving portion respectively, two pivoting portions extending outward from the bent portions respectively, and two operating portions extending from the pivoting portions respectively, the pivoting portions of the operating member resist against and ride over the locking tabs of the resisting member along an outer surface of the locking tabs to engage in the locking cutouts of the resisting member respectively, then the locking tabs restore to lock the pivoting portions in the locking cutouts of the resisting member, the operating portion is capable of being driven to rotate the operating member around the pivoting portions.

7. The assembly as described in claim 6, wherein the resisting member is made by bending a resilient metal plate.

8. The assembly as described in claim 6, wherein the operating member is made of a resilient metal wire.

9. The assembly as described in claim 6, wherein at least one through hole is defined in each of the wing portions, a plurality of mounting posts protrudes from the slide rail for engaging with the resisting member.

10. The mounting apparatus as described in claim 9, wherein the resisting member comprises a connecting portion for connecting the resisting portion to the main body, the driving portion is configured for resisting against the connecting portion of the resisting member.

11. The mounting apparatus as described in claim 10, wherein the connecting portion comprises a protrusion extending up therefrom, for blocking the driving portion of the operating member.

12. The mounting apparatus as described in claim 11, wherein an inclined surface is formed on a top of the protrusion for enabling the driving portion of the operating member to easily ride over the protrusion to tightly contact with the connecting portion.

* * * * *